(12) United States Patent
Tao et al.

(10) Patent No.: US 9,564,857 B2
(45) Date of Patent: Feb. 7, 2017

(54) LOW NOISE AMPLIFIER AND CHIP

(71) Applicant: SHANGHAI EASTSOFT MICROELECTRONICS CO., LTD., Shanghai (CN)

(72) Inventors: Jingjing Tao, Shanghai (CN); Xu Zhang, Shanghai (CN); Ruijin Liu, Shanghai (CN)

(73) Assignee: SHANGHAI EASTSOFT MICROELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 14/981,820

(22) Filed: Dec. 28, 2015

(65) Prior Publication Data
US 2016/0112010 A1    Apr. 21, 2016

Related U.S. Application Data

(63) Continuation of application No. PCT/CN2014/070065, filed on Jan. 3, 2014.

(30) Foreign Application Priority Data

Jul. 30, 2013    (CN) .......................... 2013 1 0326713

(51) Int. Cl.
*H03F 3/04*    (2006.01)
*H03F 1/02*    (2006.01)
(Continued)

(52) U.S. Cl.
CPC .......... *H03F 1/0205* (2013.01); *H03F 1/0266* (2013.01); *H03F 1/26* (2013.01);
(Continued)

(58) Field of Classification Search
CPC ...................................................... H03F 3/04
(Continued)

(56) References Cited

U.S. PATENT DOCUMENTS

| 6,317,000 B1 | 11/2001 | Ivanov et al. ................ 330/255 |
| 6,384,683 B1 | 5/2002 | Lin .............................. 330/257 |

(Continued)

FOREIGN PATENT DOCUMENTS

| CN | 101167245 A | 4/2008 |
| CN | 101719776 A | 6/2010 |

(Continued)

OTHER PUBLICATIONS

International Search Report of corresponding International PCT Application No. PCT/CN2014/070065, dated May 21, 2014.
(Continued)

*Primary Examiner* — Henry Choe
(74) *Attorney, Agent, or Firm* — J.C. Patents

(57) ABSTRACT

A low noise amplifier and a chip. The amplifier includes a biasing circuit unit, a first amplifying circuit unit, a first adjusting unit, a first signal input, a second signal input and a first signal output; the biasing circuit unit includes a first voltage output and a second voltage output; the first amplifying circuit unit includes a first N-type transistor, a first P-type transistor, a first output capacitor, a second output capacitor, a first impedance and a second impedance; gates of first N-type and P-type transistors are connected to first voltage output and first signal input, and second voltage output and first signal input, respectively, via adjusting unit; source of first N-type transistor is connected to source of first P-type transistor and second signal input; drains of first N-type and P-type transistors are connected respectively to impedance, and to first signal output and second signal output via output capacitor.

16 Claims, 3 Drawing Sheets

(51) Int. Cl.
H03F 3/30 (2006.01)
H03F 3/45 (2006.01)
H03F 3/16 (2006.01)
H03F 1/26 (2006.01)

(52) U.S. Cl.
CPC ............ *H03F 3/16* (2013.01); *H03F 3/3001* (2013.01); *H03F 3/45179* (2013.01); *H03F 2200/294* (2013.01); *H03F 2200/555* (2013.01); *H03F 2203/30015* (2013.01)

(58) Field of Classification Search
USPC .......................................... 330/296, 285, 311
See application file for complete search history.

(56) References Cited

U.S. PATENT DOCUMENTS

| | | | |
|---|---|---|---|
| 7,215,201 B2 | 5/2007 | Roine | 330/269 |
| 9,130,509 B2 * | 9/2015 | Xu | G01S 19/21 |
| 2006/0284679 A1 | 12/2006 | Roine | 330/253 |
| 2007/0057730 A1 * | 3/2007 | Lloyd | G05F 3/262 |
| | | | 330/288 |
| 2009/0189695 A1 * | 7/2009 | Lai | H03F 1/223 |
| | | | 330/295 |

FOREIGN PATENT DOCUMENTS

| | | |
|---|---|---|
| CN | 102647157 A | 8/2012 |
| CN | 103078596 A | 5/2013 |

OTHER PUBLICATIONS

Chinese First Examination Report of corresponding Chinese patent application No. 201310326713.2, dated on Oct. 26, 2016.

* cited by examiner

US 9,564,857 B2

LOW NOISE AMPLIFIER AND CHIP

CROSS-REFERENCE TO RELATED APPLICATIONS

This application is a continuation of International Application No. PCT/CN2014/070065, filed on Jan. 3, 2014, which claims priority to Chinese Patent Application No. 201310326713.2, filed on Jul. 30, 2013, all of which are hereby incorporated by reference in their entireties.

TECHNICAL FIELD

The present invention relates to integrated circuit technologies, and more particularly, to a low noise amplifier and a chip.

BACKGROUND

With the widespread use of electronic devices, higher and higher requirements for power consumption are imposed on electronic devices (especially handheld devices) in the industry, it is because that higher power consumption means shorter service time of the electronic device, and therefore, requirements for low power consumption of electronic devices are becoming more and more urgent.

The low noise amplifier is an important component of an electronic device, and generally has a lower current using efficiency. In order to obtain a higher gain and a higher signal power to noise power ratio, more current needs to be consumed, which results in higher power consumption of the low noise amplifier and then results in higher power consumption of the electronic device containing the low noise amplifier.

SUMMARY

The present invention provides a low noise amplifier and a chip, so as to solve the problem that the low noise amplifier in the prior art has high power consumption.

Firstly, the present invention provides a low noise amplifier, including: a biasing circuit unit, a first amplifying circuit unit, a first adjusting unit, a first signal input, a second signal input and a first signal output, where, the biasing circuit unit is configured to provide a biasing voltage for the first amplifying circuit unit, and comprises a first voltage output and a second voltage output;

the first amplifying circuit unit comprises a first N-type transistor, a first P-type transistor, a first output capacitor, a second output capacitor, a first impedance and a second impedance;

a gate of the first N-type transistor is connected to the first voltage output of the biasing circuit unit by means of the first adjusting unit, and is connected to the first signal input by means of the first adjusting unit; a gate of the first P-type transistor is connected to the second voltage output of the biasing circuit unit by means of the first adjusting unit, and is connected to the first signal input by means of the first adjusting unit; a source of the first N-type transistor is connected to a source of the first P-type transistor, and the both sources are connected to the second signal input; a drain of the first N-type transistor is connected to the first impedance, and is connected to the first signal output by means of the first output capacitor, and a drain of the first P-type transistor is connected to the second impedance, and is connected to the first signal output by means of the second output capacitor;

the biasing circuit unit is connected between a high voltage end and a low voltage end of a voltage source, the first impedance of the first amplifying circuit unit is connected to the high voltage end of the voltage source, and the second impedance of the first amplifying circuit unit is connected to the low voltage end of the voltage source.

Secondly, the present invention provides a chip, including a low noise amplifier according to any one of the embodiments of the present invention, and a first signal input and a second signal input of the low noise amplifier are exposed outside the chip.

The low noise amplifier and the chip in the present invention adopt current reuse technology, so that the N-type transistor and the P-type transistor in the amplifying circuit unit can share the current. When the low noise amplifier in the present invention adopts a differential structure, twice the voltage gain can be obtained by using the same current when compared to a low noise amplifier in the prior art, that is, the same power consumption can obtain a higher gain and a larger dynamic range, correspondingly, under the same requirements on the gain and the dynamic range, the low noise amplifier in the present invention has lower power consumption.

DESCRIPTION OF EMBODIMENTS

Figure 1:
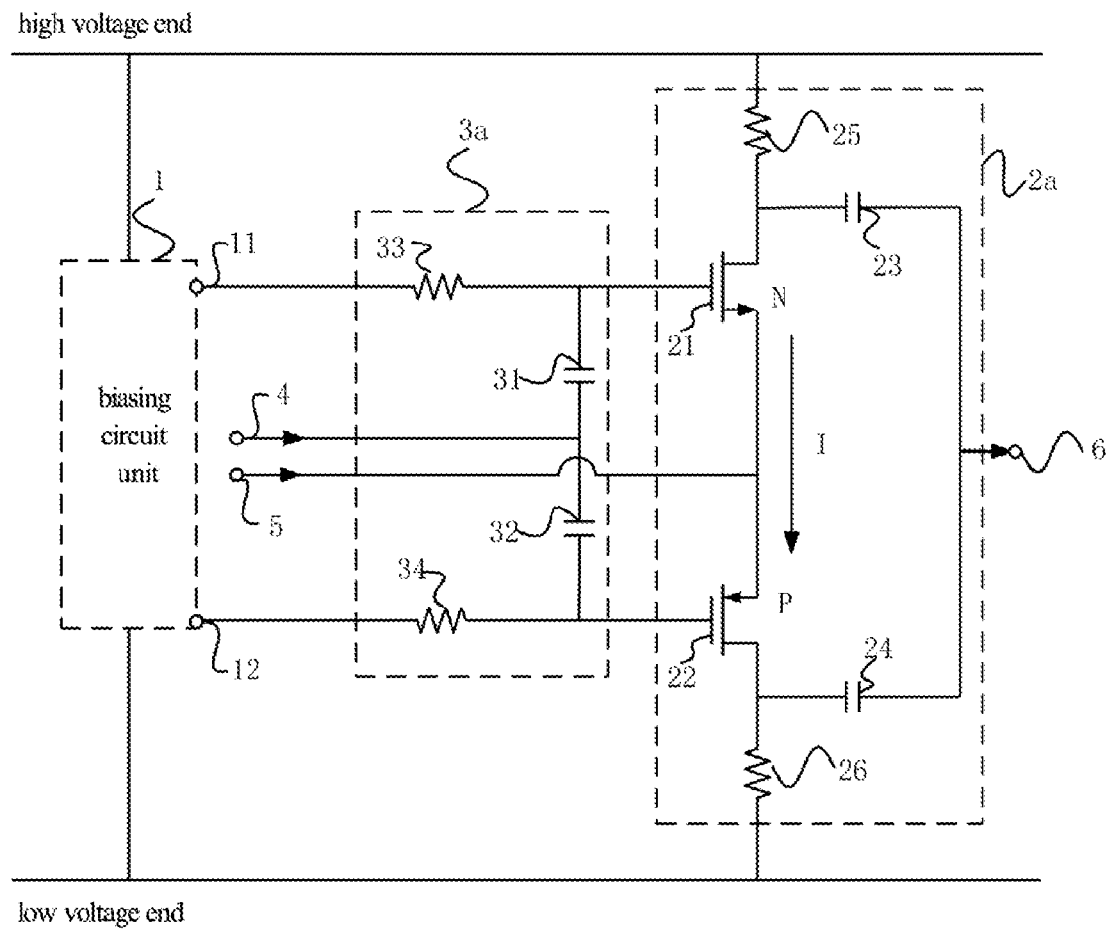
FIG. 1 is a schematic structural diagram of a low noise amplifier according to Embodiment 1 of the present invention.

FIG. 1 is a schematic structural diagram of a low noise amplifier according to Embodiment 1 of the present invention. As shown in FIG. 1, the low noise amplifier in this embodiment can include: a biasing circuit unit 1, a first amplifying circuit unit 2a, a first adjusting unit 3a, a first signal input 4, a second signal input 5 and a first signal output 6, particularly, the biasing circuit unit 1 is configured to provide a biasing voltage for the first amplifying circuit unit 2a, and includes a first voltage output 11 and a second voltage output 12;

the first amplifying circuit unit 2a includes a first N-type transistor 21, a first P-type transistor 22, a first output capacitor 23, a second output capacitor 24, a first impedance 25 and a second impedance 26;

a gate of the first N-type transistor 21 is connected to the first voltage output 11 of the biasing circuit unit 1 by means of the first adjusting unit 3a, and is connected to the first signal input 4 by means of the first adjusting unit 3a; a gate of the first P-type transistor 22 is connected to the second voltage output 12 of the biasing circuit unit 1 by means of the first adjusting unit 3a, and is connected to the first signal input 4 by means of the first adjusting unit 3a; a source of the first N-type transistor 21 is connected to a source of the first P-type transistor 22, and the both sources are connected to the second signal input 5; a drain of the first N-type transistor 21 is connected to the first impedance 25, and is connected to the first signal output 6 by means of the first output capacitor 23, and a drain of the first P-type transistor 22 is connected to the second impedance 26, and is connected to the first signal output 6 by means of the second output capacitor 24;

the biasing circuit unit 1 is connected between a high voltage end and a low voltage end of a voltage source, the first impedance 25 of the first amplifying circuit unit 2a is connected to the high voltage end of the voltage source, and the second impedance 26 of the first amplifying circuit unit 2a is connected to the low voltage end of the voltage source.

In particular, optionally, the first N-type transistor 21 can be an N-type metal-oxide semiconductor (NMOS), the first P-type transistor 22 can be a P-type metal-oxide semiconductor (PMOS); or, the first N-type transistor 21 can be an NPN bipolar transistor, the first P-type transistor 22 can be a PNP bipolar transistor.

Optionally, both the first impedance 25 and the second impedance 26 are resistors, or, both the first impedance 25 and the second impedance 26 are inductors.

Further, particularly, the first adjusting unit 3a can include: a first blocking capacitor 31, a second blocking capacitor 32, a first biasing resistor 33 and a second biasing resistor 34, where the first blocking capacitor 31 is connected between the first signal input 4 and the gate of the first N-type transistor 21, and the second blocking capacitor 32 is connected between the first signal input 4 and the gate of the first P-type transistor 22;

the first biasing resistor 33 is connected between the gate of the first N-type transistor 21 and the first voltage output 11, and the second biasing resistor 34 is connected between the gate of the first P-type transistor 22 and the second voltage output 12.

Further, preferably, a voltage at the first voltage output 11 is higher than a voltage of the second voltage output 12; and the phase difference between signals at the first signal input 4 and the second signal input 5 with 180 degrees is preferred.

Further, preferably, the biasing circuit unit 1 can include: an adjustable current source, for adjusting voltage level of the biasing circuit unit.

In this embodiment, the first amplifying circuit unit 2a includes the first signal input 4 and the second signal input 5, both of which can be connected to a differential input signal, thus allowing the low noise amplifier in this embodiment to apply in a circuit with a differential structure. The low noise amplifier in this embodiment also can be operated in a single-ended mode, that is, one of the signal inputs is idle while only one signal input is used.

It can be seen that the first N-type transistor 21 and the first P-type transistor 22 in the first amplifying circuit unit 2a of the low noise amplifier can share the current, if the first N-type transistor 21 and the first P-type transistor 22 have the same amplifying capabilities, then twice the amplifying effect can be achieved by using the same current I. In the prior art, however, one current I generally can amplify only one N-type transistor or one P-type transistor, therefore, the low noise amplifier circuit in this embodiment achieves current reuse, that is, the transistor (it is assumed that the first N-type transistor 21 and the first P-type transistor 22 have the same amplifying capabilities) achieves twice the amplifying effect; in the prior art, however, one current I only can achieve the amplifying capability of one transistor, in order to achieve twice the amplifying effect, a current of 2I is needed; and therefore, such an advantage is referred to as current reuse.

Further, in the first amplifying circuit unit 2a of the low noise amplifier, it is assumed that the first N-type transistor 21 is an NMOS, the first P-type transistor 22 is a PMOS, transconductance values of the NMOS and the PMOS are both gm. The relationship between the transconductance gm and the current I flowing through the NMOS or the PMOS can be represented by the following formula (1):

$$gm = \sqrt{2 \times K \times \left(\frac{W}{L}\right) \times I} \qquad (1)$$

where, K is a transconductance parameter of the NMOS or the PMOS, W is the width of the NMOS or the PMOS, and L is the length of the NMOS or the PMOS.

As will be appreciated by persons skilled in the art, the above assumption that transconductance values of the first N-type transistor 21 and the first P-type transistor 22 are both gm is based on an ideal assumption to describe the relationship between the transconductance gm and the current, in practice, however, transconductance values of the first N-type transistor 21 and the first P-type transistor 22 may not be equal.

To illustrate the working principle of the circuit, in the first amplifying circuit unit 2a of the low noise amplifier, it is assumed that the first output capacitance 23 and the second output capacitor 24 have the same capacitance values, and both the resistances of the first impedance 25 and the second impedance 26 are R. Set the voltage at the first signal input 4 be Vin, after amplification of the first amplifying circuit unit 2a, the voltage at the first signal output 6 Vout=gm×R×Vin, that is, the voltage gain of the low noise amplifier is gm×R.

When the low noise amplifier adopts a differential circuit structure, that is, differential signals are input at the first signal input 4 and the second signal input 5, the first signal output 6 adopts a two-ended form, one end is a positive signal and the other end is a negative signal. And two amplifying circuit units and two adjusting units are adopted, that is, in addition to the first amplifying circuit unit 2a and the first adjusting unit 3a described above, a second amplifying circuit unit and a second adjusting unit are also included, but there is only one biasing circuit unit 1, to provide a biasing voltage to the two amplifying circuit units respectively, then the current consumed by the low noise amplifier is 2I, and the voltage gain thereof is 2×gm×R. However, when the low noise amplifier in the prior art adopts a differential structure, the current consumed is also 2I, but the voltage gain thereof is still gm×R.

Moreover, when the low noise amplifier in this embodiment adopts the differential structure, compared to the low noise amplifier with the differential structure in the prior art, if the same current is consumed, the voltage gain of the circuit can be increased to twice, and there is no significant difference in noise between the present invention and the prior art, and the maximum signal power to noise power ratio also can be improved correspondingly, that is, the low noise amplifier in this embodiment can achieve a larger dynamic range when the differential structure is adopted.

Since the low noise amplifier in this embodiment adopts the current reuse technology, so that the first N-type transistor and the first P-type transistor in the first amplifying circuit unit can share the current, when the low noise amplifier in this embodiment adopts the differential structure, twice the voltage gain can be obtained by consuming the same current when compared to the low noise amplifier with the differential structure in the prior art, and thus a larger dynamic range can be obtained; that is, a higher gain and a larger dynamic range can be obtained with the same power consumption, correspondingly, the low noise amplifier in the present invention has a lower power consumption under the same requirements on the gain and the dynamic range.

Figure 2:
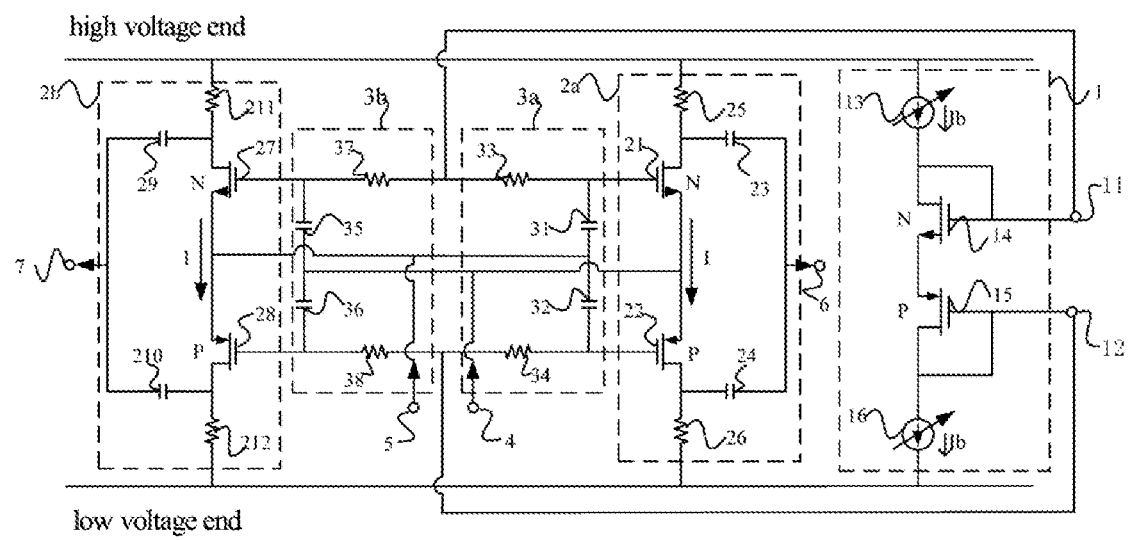
FIG. 2 is a schematic structural diagram of a low noise amplifier according to Embodiment 2 of the present invention.

FIG. 2 is a schematic structural diagram of a low noise amplifier according to Embodiment 2 of the present invention. As shown in FIG. 2, on the basis of the embodiment of the low noise amplifier shown in FIG. 1, the low noise amplifier in this embodiment further can include: a second amplifying circuit unit 2b, a second adjusting unit 3b and a second signal output 7, particularly, the first amplifying circuit unit 2a is connected to the second amplifying circuit unit 2b in a differential mode. For clarity of description, components and connection relations of the low noise amplifier in this embodiment will be described in detail below.

The low noise amplifier in this embodiment can include: a biasing circuit unit 1, a first amplifying circuit unit 2a, a first adjusting unit 3a, a second amplifying circuit 2b, a second adjusting unit 3b, a first signal input 4, a second signal input 5, a first signal output 6 and a second signal output 7, particularly, the biasing circuit unit 1 is configured to provide a biasing voltage for the first amplifying circuit unit 2a and the second amplifying circuit unit 2b, and includes a first voltage output 11 and a second voltage output 12;

the first amplifying circuit unit 2a includes a first N-type transistor 21, a first P-type transistor 22, a first output capacitor 23, a second output capacitor 24, a first impedance 25 and a second impedance 26;

the second amplifying circuit unit 2b includes: a second N-type transistor 27, a second P-type transistor 28, a third output capacitor 29, a fourth output capacitor 210, a third impedance 211 and a fourth impedance 212;

a gate of the first N-type transistor 21 is connected to the first voltage output 11 of the biasing circuit unit 1 by means of the first adjusting unit 3a, and is connected to the second signal input 5 by means of the first adjusting unit 3a; a gate of the first P-type transistor 22 is connected to the second voltage output 12 of the biasing circuit unit 1 by means of the first adjusting unit 3a, and is connected to the second signal input 5 by means of the first adjusting unit 3a; a source of the first N-type transistor 21 is connected to a source of the first P-type transistor 22, and both sources are connected to the second signal input 12; a drain of the first N-type transistor 21 is connected to the first impedance 25, and is connected to the first signal output 6 by means of the first output capacitor 23, and a drain of the first P-type transistor 22 is connected to the second impedance 26, and is connected to the first signal output 6 by means of the second output capacitor 24;

a gate of the second N-type transistor 27 is connected to the first voltage output 11 of the biasing circuit unit 1 by means of the second adjusting unit 3b, and is connected to the first signal input 4 by means of the second adjusting unit 3b; a gate of the second P-type transistor 28 is connected to the second voltage output 12 of the biasing circuit unit 1 by means of the second adjusting unit 3b, and is connected to the first signal input 4 by means of the second adjusting unit 3b; a source of the first N-type transistor 27 is connected to a source of the second P-type transistor 28, and both sources are connected to the first signal input 4; a drain of the second N-type transistor 27 is connected to the third impedance 211, and is connected to the second signal output 7 by means of the third output capacitor 29, and a drain of the second P-type transistor 28 is connected to the fourth impedance 212, and is connected to the second signal output 7 by means of the fourth output capacitor 210;

the gate of the first N-type transistor 21 is connected to the gate of the second N-type transistor 27 by means of the first adjusting unit 3a and the second adjusting unit 3b, the gate of the first P-type transistor 22 is connected to the gate of the second P-type transistor 28 by means of the first adjusting unit 3a and the second adjusting unit 3b;

the biasing circuit unit 1 is connected between a high voltage end and a low voltage end of a voltage source, the first impedance 25 of the first amplifying circuit unit 2a is connected to the high voltage end of the voltage source, and the second impedance 26 of the first amplifying circuit unit 2a is connected to the low voltage end of the voltage source; the third impedance 211 of the second amplifying circuit unit 2b is connected to the high voltage end of the voltage source, and the fourth impedance 212 of the second amplifying circuit unit 2b is connected to the low voltage end of the voltage source.

Further, optionally, the first N-type transistor 21 and the second N-type transistor 27 can be N-type metal oxide semiconductors NMOSs, the first P-type transistor 22 and the second P-type transistor 28 can be P-type metal oxide semiconductors PMOSs; or the first N-type transistor 21 and the second N-type transistor 27 can be NPN bipolar transistors, the first P-type transistor 22 and the second P-type transistor 28 can be PNP bipolar transistors.

Further, optionally, the first impedance, the second impedance, the third impedance and the fourth impedance are all resistors, or, the first impedance, the second impedance, the third impedance and the fourth impedance are all inductors.

Further, particularly, the first adjusting unit 3a can include: a first blocking capacitor 31, a second blocking capacitor 32, a first biasing resistor 33 and a second biasing resistor 34, particularly, the first blocking capacitor 31 is connected between the second signal input 5 and the gate of the first N-type transistor 21, and the second blocking capacitor 32 is connected between the second signal input 5 and the gate of the first P-type transistor 22;

the first biasing resistor 33 is connected between the gate of the first N-type transistor 21 and the first voltage output 11 and the second biasing resistor 34 is connected between the gate of the first P-type transistor 22 and the second voltage output 12;

the second adjusting unit 3b includes: a third blocking capacitor 35, a fourth blocking capacitor 36, a third biasing resistor 37 and a fourth biasing resistor 38, particularly, the third blocking capacitor 35 is connected between the first signal input 4 and the gate of the second N-type transistor 27, and the fourth blocking capacitor 36 is connected between the first signal input 4 and the gate of the second P-type transistor 28;

the third biasing resistor 37 is connected between the gate of the second N-type transistor 27 and the first voltage output 11 and the fourth biasing resistor 28 is connected between the gate of the second P-type transistor 28 and the second voltage output 12.

Further, preferably, a voltage at the first voltage output 11 is higher than a voltage of the second voltage output 12; and the phase difference between signals at the first signal input 4 and the second signal input 5 with 180 degrees is preferred.

Further, preferably, the biasing circuit unit can include: an adjustable current source, for adjusting voltage level of the biasing circuit unit.

In this embodiment, the first signal input 4 and the second signal input 5 can be used to input differential signals, where one end is a positive signal and the other end is a negative signal, and the first signal output 6 and the second signal output 7 can be used to output the amplified differential signals. Moreover, the low noise amplifier in this embodiment includes two amplifying circuit units 2a, 2b and two adjusting units 3a, 3b, but there is only one biasing circuit unit 1 which provides a biasing voltage to the two amplifying circuit units respectively.

Set the voltage at the first signal input 4 and the second signal input 5 be Vin_P and Vin_N respectively, the voltage at the first signal output 6 and the second signal output 7 be Vout_P and Vout_N respectively, and in order to illustrate the principle of the circuit, it is assumed that a transconductance value of each transistor is gm, resistance values of the first impedance 25, the second impedance 26, the third impedance 211 and the fourth impedance 212 are all R, formula (2) and formula (3) can be obtained based on the principle of the circuit, $$Vout\_P=(Vin\_N-Vin\_P)\times gm\times R \quad (2)$$

$$Vout\_N=(Vin\_P-Vin\_N)\times gm\times R \quad (3)$$

The gain of the differential low noise amplifier can be obtained by a calculating formula (4) of the voltage gain:

$$Gain=(Vout\_P-Vout\_N)/(Vin\_P-Vin\_N)=-2\times gm\times R \quad (4)$$

where, the negative sign indicates that the current flows from the first N-type transistor 21 to the first P-type transistor 22, and from the second N-type transistor 27 to the second P-type transistor 28, the magnitude of the gain is $2\times gm\times R$.

As will be appreciated by persons skilled in the art, the above ideal assumption is to describe the principle of the circuit, in practice, however, transconductance values of respective transistors may not be equal, and resistance values of respective impedances can be different.

In this embodiment, the current consumed by the circuit is I, and a gain of $2\times gm\times R$ can be obtained; in terms of the low noise amplifier with a differential structure in the prior art, in order to obtain a gain of $2\times gm\times R$, a current of 2I needs to be consumed. Therefore, when the same current is consumed, the low noise amplifier circuit in the present invention can provide a higher gain than that in the prior art.

Meanwhile, when the current with the same values is consumed, the low noise amplifier circuit in the present invention has substantially the same output noise with the low noise amplifier circuit in the prior art, according to an equivalent input noise formula: equivalent input noise=output noise/circuit gain, since the circuit in this embodiment can provide a higher gain, the equivalent input noise thereof is lower. Then, according to the definition of the dynamic range: dynamic range=maximum allowable input voltage/equivalent input noise, it can be seen that, under the same application condition, since the equivalent input noise in this embodiment is much lower, a larger dynamic range can be obtained.

To sum up, the low noise amplifier in this embodiment can obtain a higher gain than the differential low noise amplifier in the prior art when the current with the same values is consumed, and thus a higher signal power to noise power ratio of the circuit, and therefore, under the same power consumption, a greater dynamic range and a greater sensitivity can be obtained.

Figure 3:
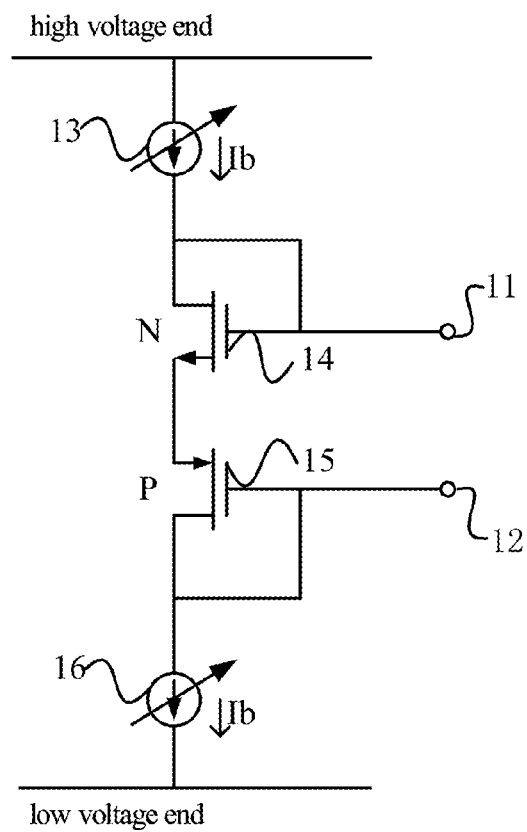
FIG. 3 is a schematic structural diagram of a biasing circuit unit according to an embodiment of the present invention.

FIG. 3 is a schematic structural diagram of a biasing circuit unit according to an embodiment of the present invention, the biasing circuit unit in this embodiment can act as the biasing circuit unit 1 in FIG. 1 or FIG. 2. As shown in FIG. 3, the biasing circuit unit in this embodiment can include a first current source 13, a third N-type transistor 14, a third P-type transistor 15 and a second current source 16 which are serially connected between a high voltage end and a low voltage end of the voltage source, and can further includes a first voltage output 11 and a second voltage output 12, particularly, a gate of the third N-type transistor 14 is connected to a drain of the third N-type transistor 14, a gate of the third P-type transistor 15 is connected to a drain of the third P-type transistor 15; a source of the third N-type transistor 14 is connected to a source of the third P-type transistor 15, the gate of the third N-type transistor 14 and the gate of the third P-type transistor 15 are connected to the first voltage output 11 and the second voltage output 12 respectively.

The biasing circuit unit in this embodiment can be designed as the biasing circuit unit of the low noise amplifier shown in FIG. 1, or the biasing circuit unit of the low noise amplifier shown in FIG. 2.

Further, preferably, the first current source 13 and the second current source 16 can adopt adjustable current sources, for adjusting voltage level of the biasing circuit unit.

The biasing circuit unit 1 in this embodiment can provide direct current biasing voltages Vb1, Vb2 for the low noise amplifier, in particular, the first current source 13 and the second current source 16 can provide the same currents Ib, the currents Ib flow through the third N-type transistor 14 and the third P-type transistor 15 respectively, and generates biasing voltages Vb2 at the first voltage output 11 and Vb1 at the second voltage output 12 respectively.

Since the first current source 13 and the second current source 16 adopt adjustable current sources, and the currents of the first current source 13 and the second current source 16 can be adjusted simultaneously, thus the value of biasing voltages Vb2 of the first voltage output 11 and the value of Vb1 of the second voltage output 12 can be adjusted, and therefore, by means of adjusting the value of the current I passing through the N-type transistor and the P-type transistor in the amplifying circuit unit, the gain of the low noise amplifier is adjusted then. The specific adjusting process is as follows: since characteristic parameters of the third N-type transistor 14 and the third P-type transistor 15 in the biasing circuit unit 1 are fixedly proportional to the characteristic parameters of the first N-type transistor 21 and the first P-type transistor 22 in the amplifying circuit unit 2 of the embodiment shown in FIG. 1, or to the characteristic parameters of the first N-type transistor 21 and the first P-type transistor 22 in the first amplifying circuit unit 2a, as well as the second N-type transistor 27 and the second P-type transistor 28 in the second amplifying circuit unit 2b of the embodiment shown in FIG. 2, therefore, by means of adjusting the currents of the first current source 13 and the second current source 16, that is, simultaneously increasing or reducing the current Ib, the current I flowing through the first N-type transistor 21 and the first P-type transistor 22 in the amplifying circuit unit 2 of the embodiment shown in FIG. 1, or the current I flowing through the first N-type transistor 21 and the first P-type transistor 22 in the first amplifying circuit unit 2a, as well as the second N-type transistor 27 and the second P-type transistor 28 in the second amplifying circuit unit 2b of the embodiment shown in FIG. 2 will increase or reduce in the fixed proportion described above; the transconductances gm of the first N-type transistor 21 and the first P-type transistor 22 in the amplifying circuit unit 2 of the embodiment shown in FIG. 1 have a relationship with the current I; the transconductances gm of the first N-type transistor 21 and the first P-type transistor 22 in the first amplifying circuit unit 2a, as well as the transconductances gm of the second N-type transistor 27 and the second P-type transistor 28 in the second amplifying circuit unit 2b of the embodiment shown in FIG. 2 all have a relationship with the current I, as shown in formula (1), and therefore, the values of gm will be increased or reduced proportionally therewith, and the voltage gain is proportional to the value of gm, and thus the voltage gain also can be increased or reduced proportionally therewith.

In this embodiment, by means of two adjustable current sources in the biasing circuit unit, the adjustment of the gain of the low noise amplifier can be achieved by adjusting the currents of the current sources.

Figure 4:
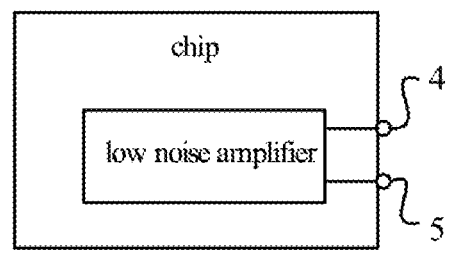
FIG. 4 is a schematic structural diagram of a chip according to an embodiment of the present invention.

FIG. 4 is a schematic structural diagram of a chip according to an embodiment of the present invention, as shown in FIG. 4, the chip in this embodiment can include: the low noise amplifier according to any of the embodiments of the present invention, the first signal input 4 and the second signal input 5 of the low noise amplifier are exposed outside the chip.

In particular, the low noise amplifier can be made to an integrated circuit (IC), and the IC is embedded in a chip, and the chip needs to reserve interfaces as the first signal input 4 and the second signal input 5 for connecting external devices of the chip, so as to input differential signals.

In this embodiment, since the integrated circuit of the chip adopts a low noise amplifier having a higher gain and a larger dynamic range under the same power consumption, the gain and dynamic range of a receiver adopting the chip in this embodiment can be improved.

Finally, it should be noted that the above embodiments are merely provided for describing the technical solutions of the present invention, but not intended to limit the present invention. It should be understood by skilled people in the art that although the present invention has been described in detail with reference to the foregoing embodiments, modifications can be made to the technical solutions described in the foregoing embodiments, or equivalent replacements can be made to partial or all technical features in the technical solutions; however, such modifications or replacements do not cause the essence of corresponding technical solutions to depart from the scope of technical solutions in the embodiments of the present invention.

What is claimed is:

1. A low noise amplifier, comprising: a biasing circuit unit, a first amplifying circuit unit, a first adjusting unit, a first signal input, a second signal input, a first signal output, a second amplifying circuit unit, a second adjusting unit and a second signal output, wherein, the biasing circuit unit is configured to provide a biasing voltage for the first amplifying circuit unit and the second amplifying circuit unit, and comprises a first voltage output and a second voltage output;

the first amplifying circuit unit comprises a first N-type transistor, a first P-type transistor, a first output capacitor, a second output capacitor, a first impedance, and a second impedance;

the second amplifying circuit unit comprises a second N-type transistor, a second P-type transistor, a third output capacitor, a fourth output capacitor, a third impedance, and a fourth impedance;

a gate of the first N-type transistor is connected to the first voltage output of the biasing circuit unit by means of the first adjusting unit, and is connected to the second signal input by means of the first adjusting unit; a gate of the first P-type transistor is connected to the second voltage output of the biasing circuit unit by means of the first adjusting unit, and is connected to the second signal input by means of the first adjusting unit; a source of the first N-type transistor is connected to a source of the first P-type transistor, and both sources are connected to the second signal input; a drain of the first N-type transistor is connected to the first impedance, and is connected to the first signal output by means of the first output capacitor, and a drain of the first P-type transistor is connected to the second impedance, and is connected to the first signal output by means of the second output capacitor;

a gate of the second N-type transistor is connected to the first voltage output of the biasing circuit unit by means of the second adjusting unit, and is connected to the first signal input by means of the second adjusting unit; a gate of the second P-type transistor is connected to the second voltage output of the biasing circuit unit by means of the second adjusting unit, and is connected to the first signal input by means of the second adjusting unit; a source of the second N-type transistor is connected to a source of the second P-type transistor, and both sources are connected to the first signal input; a drain of the second N-type transistor is connected to the third impedance, and is connected to the second signal output by means of the third output capacitor, and a drain of the second P-type transistor is connected to the fourth impedance, and is connected to the second signal output by means of the fourth output capacitor;

the gate of the first N-type transistor is connected to the gate of the second N-type transistor by means of the first adjusting unit and the second adjusting unit, the gate of the first P-type transistor is connected to the gate of the second P-type transistor by means of the first adjusting unit and the second adjusting unit;

the biasing circuit unit is connected between a high voltage end and a low voltage end of a voltage source, the first impedance of the first amplifying circuit unit is connected to the high voltage end of the voltage source, and the second impedance of the first amplifying circuit unit is connected to the low voltage end of the voltage source; the third impedance of the second amplifying circuit unit is connected to the high voltage end of the voltage source, and the fourth impedance of the second amplifying circuit unit is connected to the low voltage end of the voltage source;

wherein the biasing circuit unit comprises a first current source, a third N-type transistor, a third P-type transistor and a second current source which are serially connected between the high voltage end and the low voltage end of the voltage source, and further comprises a first voltage output and a second voltage output; wherein, a gate of the third N-type transistor is connected to a drain of the third N-type transistor, a gate of the third P-type transistor is connected to a drain of the third P-type transistor; a source of the third N-type transistor is connected to a source of the third P-type transistor, the gate of the third N-type transistor and the gate of the third P-type transistor are connected to the first voltage output and the second voltage output respectively.

2. The low noise amplifier according to claim 1, wherein, the first adjusting unit comprises: a first blocking capacitor, a second blocking capacitor, a first biasing resistor and a second biasing resistor, wherein,
 the first blocking capacitor is connected between the first signal input and the gate of the first N-type transistor, and the second blocking capacitor is connected between the first signal input and the gate of the first P-type transistor;
 the first biasing resistor is connected between the gate of the first N-type transistor and the first voltage output, and the second biasing resistor is connected between the gate of the first P-type transistor and the second voltage output.

3. The low noise amplifier according to claim 1, wherein, the second N-type transistor is an N-type metal oxide semiconductor (NMOS), the second P-type transistor is a P-type metal oxide semiconductor (PMOS); or the second N-type transistor is an NPN bipolar transistor, the second P-type transistor is a PNP bipolar transistor.

4. The low noise amplifier according to claim 1, wherein, both the third impedance and the fourth impedance are resistors, or both the third impedance and the fourth impedance are inductors.

5. The low noise amplifier according to claim 2, wherein, the first blocking capacitor is connected between the second signal input and the gate of the first N-type transistor, and the second blocking capacitor is connected between the second signal input and the gate of the first P-type transistor;
 the first biasing resistor is connected between the gate of the first N-type transistor and the first voltage output, and the second biasing resistor is connected between the gate of the first P-type transistor and the second voltage output;
 the second adjusting unit comprises: a third blocking capacitor, a fourth blocking capacitor, a third biasing resistor and a fourth biasing resistor, wherein,
 the third blocking capacitor is connected between the first signal input and the gate of the second N-type transistor, and the fourth blocking capacitor is connected between the first signal input and the gate of the second P-type transistor;
 the third biasing resistor is connected between the gate of the second N-type transistor and the first voltage output, and the fourth biasing resistor is connected between the gate of the second P-type transistor and the second voltage output.

6. The low noise amplifier according to claim 1, wherein, the first N-type transistor is an N-type metal oxide semiconductor (NMOS), the first P-type transistor is a P-type metal oxide semiconductor (PMOS); or the first N-type transistor is an NPN bipolar transistor, the first P-type transistor is a PNP bipolar transistor.

7. The low noise amplifier according to claim 1, wherein, both the first impedance and the second impedance are resistors, or both the first impedance and the second impedance are inductors.

8. The low noise amplifier according to claim 1, wherein, a phase difference between signals at the first signal input and the second signal input is 180 degrees.

9. A chip, comprising a low noise amplifier according to claim 1, the first signal input and the second signal input of the low noise amplifier are exposed outside the chip.

10. The chip according to claim 9, wherein, the first adjusting unit comprises: a first blocking capacitor, a second blocking capacitor, a first biasing resistor and a second biasing resistor, wherein,
 the first blocking capacitor is connected between the first signal input and the gate of the first N-type transistor, and the second blocking capacitor is connected between the first signal input and the gate of the first P-type transistor;
 the first biasing resistor is connected between the gate of the first N-type transistor and the first voltage output, and the second biasing resistor is connected between the gate of the first P-type transistor and the second voltage output.

11. The chip according to claim 9, wherein,
the second N-type transistor is an N-type metal oxide semiconductor (NMOS), the second P-type transistor is a P-type metal oxide semiconductor (PMOS); or
the second N-type transistor is an NPN bipolar transistor, the second P-type transistor is a PNP bipolar transistor.

12. The chip according to claim 9, wherein,
both the third impedance and the fourth impedance are resistors, or both the third impedance and the fourth impedance are inductors.

13. The chip according to claim 10, wherein,
the first blocking capacitor is connected between the second signal input and the gate of the first N-type transistor, and the second blocking capacitor is connected between the second signal input and the gate of the first P-type transistor;
the first biasing resistor is connected between the gate of the first N-type transistor and the first voltage output, and the second biasing resistor is connected between the gate of the first P-type transistor and the second voltage output;
the second adjusting unit comprises: a third blocking capacitor, a fourth blocking capacitor, a third biasing resistor and a fourth biasing resistor, wherein,
the third blocking capacitor is connected between the first signal input and the gate of the second N-type transistor, and the fourth blocking capacitor is connected between the first signal input and the gate of the second P-type transistor;
the third biasing resistor is connected between the gate of the second N-type transistor and the first voltage output, and the fourth biasing resistor is connected between the gate of the second P-type transistor and the second voltage output.

14. The chip according to claim 9, wherein:
the first N-type transistor is an N-type metal oxide semiconductor (NMOS), the first P-type transistor is a P-type metal oxide semiconductor (PMOS); or
the first N-type transistor is an NPN bipolar transistor, the first P-type transistor is a PNP bipolar transistor.

15. The chip according to claim 9, wherein:
both the first impedance and the second impedance are resistors, or both the first impedance and the second impedance are inductors.

16. The chip according to claim 9, wherein, a phase difference between signals at the first signal input and the second signal input is 180 degrees.

* * * * *